United States Patent
Abe (10) Patent No.: US 7,050,920 B2
(45) Date of Patent: May 23, 2006

(54) SEMICONDUCTOR DEVICE HAVING A TEST CIRCUIT FOR TESTING AN OUTPUT CIRCUIT

(75) Inventor: Tsuneo Abe, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/260,233

(22) Filed: Oct. 28, 2005

(65) Prior Publication Data

US 2006/0064272 A1    Mar. 23, 2006

Related U.S. Application Data

(62) Division of application No. 10/758,527, filed on Jan. 16, 2004.

(30) Foreign Application Priority Data

Jan. 20, 2003   (JP) .............................. 2003-011440

(51) Int. Cl.
   *G01R 27/00* (2006.01)

(52) U.S. Cl. .................. 702/118; 327/376; 327/377

(58) Field of Classification Search .................. 702/57, 702/64, 117, 118, 119, 120, 121, 123, 189; 326/26, 27, 106, 109; 327/321, 376, 377, 327/432, 333; 365/189.05, 189.09; 324/763, 324/765
See application file for complete search history.

(56) References Cited

U.S. PATENT DOCUMENTS

| | | | | |
|---|---|---|---|---|
| 5,006,809 | A | * | 4/1991 | Mang et al. ................. 324/715 |
| 5,371,457 | A | * | 12/1994 | Lipp ........................ 324/158.1 |
| 5,420,525 | A | | 5/1995 | Maloberti et al. ............. 326/27 |
| 5,570,259 | A | * | 10/1996 | Allmeier et al. .............. 361/86 |
| 5,708,606 | A | | 1/1998 | Tanzawa et al. ........ 365/185.17 |
| 5,808,502 | A | * | 9/1998 | Hui et al. .................... 327/333 |
| 5,875,103 | A | | 2/1999 | Bhagwat et al. .............. 363/17 |
| 6,100,830 | A | | 8/2000 | Dedic ......................... 341/136 |
| 6,313,657 | B1 | * | 11/2001 | Hashimoto ................... 324/763 |
| 6,833,722 | B1 | * | 12/2004 | Cirkel et al. ................. 324/765 |

FOREIGN PATENT DOCUMENTS

| | | |
|---|---|---|
| JP | 11-30649 | 2/1999 |
| JP | 2000-214225 | 8/2000 |

* cited by examiner

*Primary Examiner*—Marc S. Hoff
*Assistant Examiner*—Mohamed Charioui
(74) *Attorney, Agent, or Firm*—McGinn IP Law Group, PLLC (57) ABSTRACT

A method for testing an output circuit of a semiconductor device including a plurality of output circuits includes the step of turning ON p-ch and n-ch MIS transistors of a subject output circuit, turning ON and OFF one and the other, respectively, of p-ch and n-ch MIS transistors of another output circuit used as a reference output circuit, measuring the potential difference between the output terminal of the subject output circuit and the output terminal of the reference output circuit and the penetrating current of the subject output circuit, and calculating the ON-resistance of the p-ch or n-ch transistor of the subject output circuit.

5 Claims, 6 Drawing Sheets

|  | $T_P$ ON<br>$T_N$ ON | $T_P$ ON<br>$T_N$ OFF | $T_P$ OFF<br>$T_N$ ON | $T_P$ OFF<br>$T_N$ OFF |
|---|---|---|---|---|
| $g_P$ | GND | GND | VDD(Q) | VDD(Q) |
| $g_N$ | VDD(Q) | GND | VDD(Q) | GND |

SEMICONDUCTOR DEVICE HAVING A TEST CIRCUIT FOR TESTING AN OUTPUT CIRCUIT

The present application is a Divisional application of U.S. patent application Ser. No. 10/758,527, filed on Jan. 16, 2004.

BACKGROUND OF THE INVENTION (a) Field of the Invention

The present invention relates to semiconductor device having a test circuit for testing an output circuit thereof, and a method for testing the output circuit of a semiconductor device.

(b) Description of the Related Art

A semiconductor device such as IC or LSI having therein output circuits, e.g. buffer circuits, is subjected to a characteristic test wherein the resistance of the output terminal (external terminal) of the output circuit is measured. In the characteristic test, after the output circuit is applied with a power source voltage from the tester via a probe or socket, the output voltage on the external terminal is measured, and the resistance of the external terminal is obtained therefrom. Since an especially higher accuracy is requested in the measurement of the resistance for the output circuit nowadays, it is improper to neglect the contact resistance on the external terminal caused by the probe or socket as well as the resistance of the tester itself during the voltage measurement.

Figure 7:
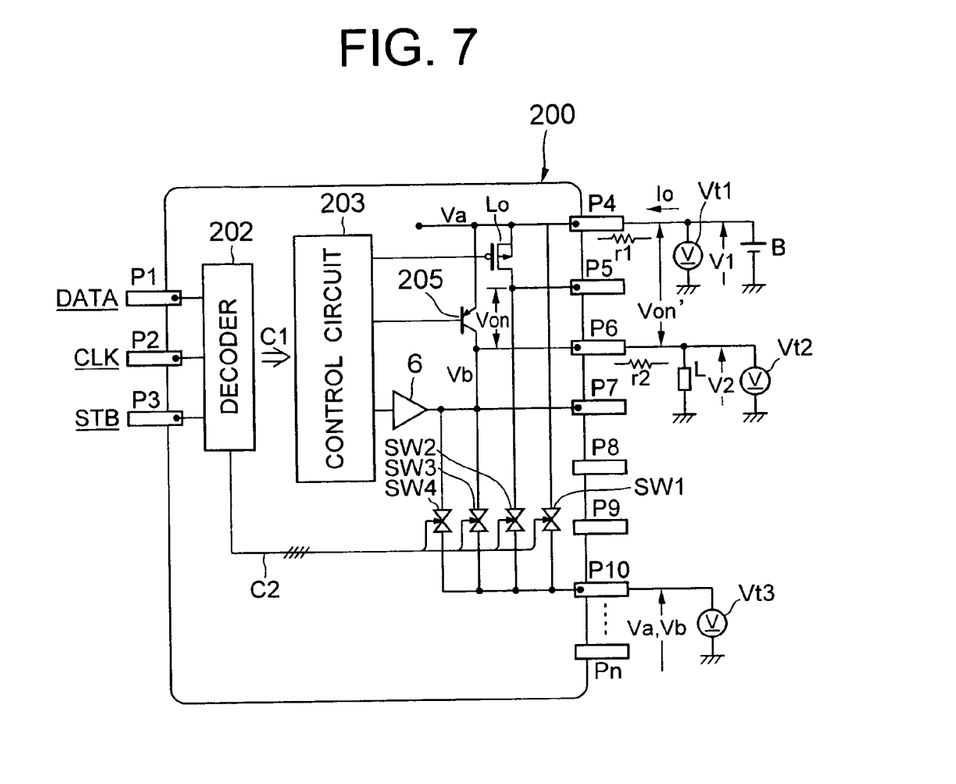
FIG. 7 is a schematic block diagram of a test circuit during testing a conventional semiconductor device.

Patent Publication JP-A-2000-214225 describes a technique for improving the accuracy in the characteristic test, wherein dedicated test terminals are used for the characteristic test. FIG. 7 shows the test circuit described in the publication. In the semiconductor device 200, if a specified combination of signals is applied through input terminals P1 to P3, a decoder 202 delivers a first control signal C1, based on which a control circuit 203 turns ON a bipolar transistor 205, for example, whereby bipolar transistor 205 is subjected to the characteristic test.

In the characteristic test of bipolar transistor 205, a power source terminal P4 is connected to a test power source (battery) B1, an output terminal is connected to a measurement load L1, and a sense terminal P10 is connected to a voltmeter Vt3. A current I0 flows from the battery B1 through power source terminal P4, bipolar transistor 205, output terminal P6 and the measurement load L1. In this state, decoder 202 delivers a second control signal C2, to turn ON a first switch SW1 for a specified time interval, whereby voltmeter Vt3 connected to the sense terminal P10 indicates the voltage Va on the emitter of bipolar transistor 205 (or source terminal P4). Subsequently, a third switch SW3 is turned ON for a specified time interval, whereby voltmeter Vt3 connected to the sense terminal P10 indicates the voltage Vb on the collector of bipolar transistor 205 (or output terminal P6).

Current I0 supplied from the battery B1 is also measured, and the ON-resistance of bipolar transistor 205 is obtained based on current I0 and voltages Va and Vb thus measured. In the described technique, either the potential of the power source terminal P4 or the output terminal P6 is delivered through the sense terminal P10 by selectively turning ON the first switch SW1 or the third switch SW3. By delivering the potential of the power source terminal P4 or the output terminal P6, the emitter-to-collector voltage drop Von of bipolar transistor 205 can be obtained while substantially removing the influence by the contact resistance involved by the connection of the measurement load L1 to the output terminal P6.

In the technique described in JP-A-2000-214225, however, the dedicated test terminals provided for the semiconductor device significantly increases the dimensions of the semiconductor device.

Figure 8:
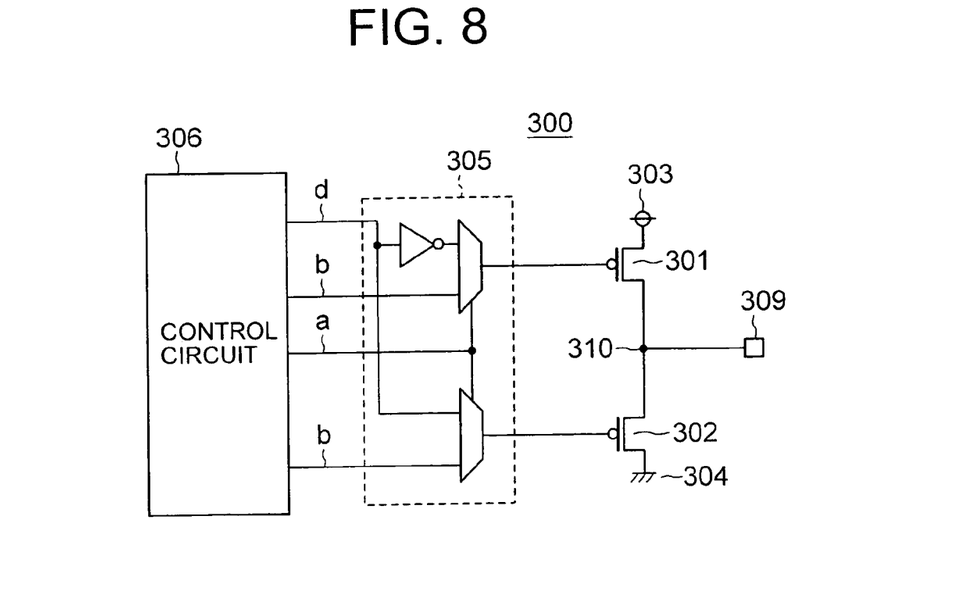
FIG. 8 is a schematic block diagram of a test circuit during testing another conventional semiconductor device.

JP-A-11-30649 describes another technique for improving the accuracy in the characteristic test of the semiconductor device, wherein the characteristic of the semiconductor device is measured without connecting the output terminal to the measurement load. FIG. 8 shows the circuit diagram during the characteristic test described therein. In the characteristic test of the semiconductor device 300, a control circuit 306 controls to turn ON both first and second transistors 301 and 302, thereby flowing a penetrating current through transistors 301 and 302.

The potential of the output terminal 309 connected to an intermediate node 310 connecting the source-drain paths of transistors 301 and 302 together is measured, and the source-to-drain voltage drops of transistors 301 and 302 are obtained based on the potential difference between the output terminal 309 and the power source terminal 303 and the potential difference between the output terminal 309 and the ground terminal 304, respectively. The characteristic of the semiconductor device 300 is obtained based on the relationship between the source-to-drain voltage drop of each transistor 301 and 302 and the current value of the penetrating current flowing from the power source terminal 303 to the ground terminal 304 through the first and second transistors 301 and 302.

In the technique described in JP-A-11-30649, the influence by the contact resistances involved with the power source terminal 303 and the ground terminal 304 is alleviated by the configuration wherein a large number of terminal pins are provided for each of the power source terminal 303 and the ground terminal 304 and are contacted by the respective probe pins connected in parallel.

However, this technique is limited to the case wherein a large number of terminal pins are provided for the power source terminals and the ground terminals, and if a smaller number of terminal pins are provided for the power source terminal or ground terminal, the influence by the contact resistances cannot be effectively removed.

SUMMARY OF THE INVENTION

In view of the above problems in the conventional techniques, it is an object of the present invention to provide method for testing a semiconductor device in a characteristic test, which is capable of improving the accuracy of the characteristic test without providing dedicated test terminals or a large number of terminal pins for the power source terminal and ground terminal of the semiconductor device.

It is another object of the present invention to provide a semiconductor device including a plurality of output circuits, which is capable of alleviating the influence by the contact resistance between the external terminals and probe pins.

The present invention is directed to a method for testing a semiconductor device including first and second power source lines, a plurality of output circuits, and a plurality of output terminals each disposed for one of the output circuits, each of the output circuits including a combination of first and second transistors connected together in series via a first node and between the first power source line and the second power source line, the first node being connected to a corresponding one of the output terminals.

The method includes the steps of: controlling the output circuits to turn ON the first and second transistors of a first output circuit among the plurality of output circuits and turn ON and OFF the first transistor and the second transistor, respectively, of t a second output circuit among the plurality of output circuits; measuring a potential difference between the output terminal of the first output circuit and the output terminal of the second output circuit and a penetrating current flowing through the first and second transistors of the first output circuit; and calculating a characteristic of the first or second transistor of the first output circuit based on the potential difference and penetrating current.

The present invention also provides a semiconductor device including: first and second power source lines; a plurality of output circuits including at least first and second output circuits, each of the output circuits including a combination of first and second transistors connected together in series via a first node and between the first power source line and the second power source line; a plurality of output terminals each disposed for one of the output circuits, the first node being connected to a corresponding one of the output terminals; and a control circuit for controlling the output circuits during a test mode to turn ON the first and second transistors of the first output circuit, and turn ON and OFF the first transistor and the second transistor, respectively.

In accordance with the method of the present invention and a method for testing the semiconductor device of the present invention, use of the output terminal of the second output circuit as the reference terminal in measuring the potential of the output terminal of the first output circuit allows the influence by the contact resistances between the probe pins and the terminals to be neglected, thereby achieving a higher-accuracy measurement, without providing dedicated test terminals or a large number of power source terminals.

The above and other objects, features and advantages of the present invention will be more apparent from the following description, referring to the accompanying drawings.

PREFERRED EMBODIMENTS OF THE INVENTION

Figure 1:
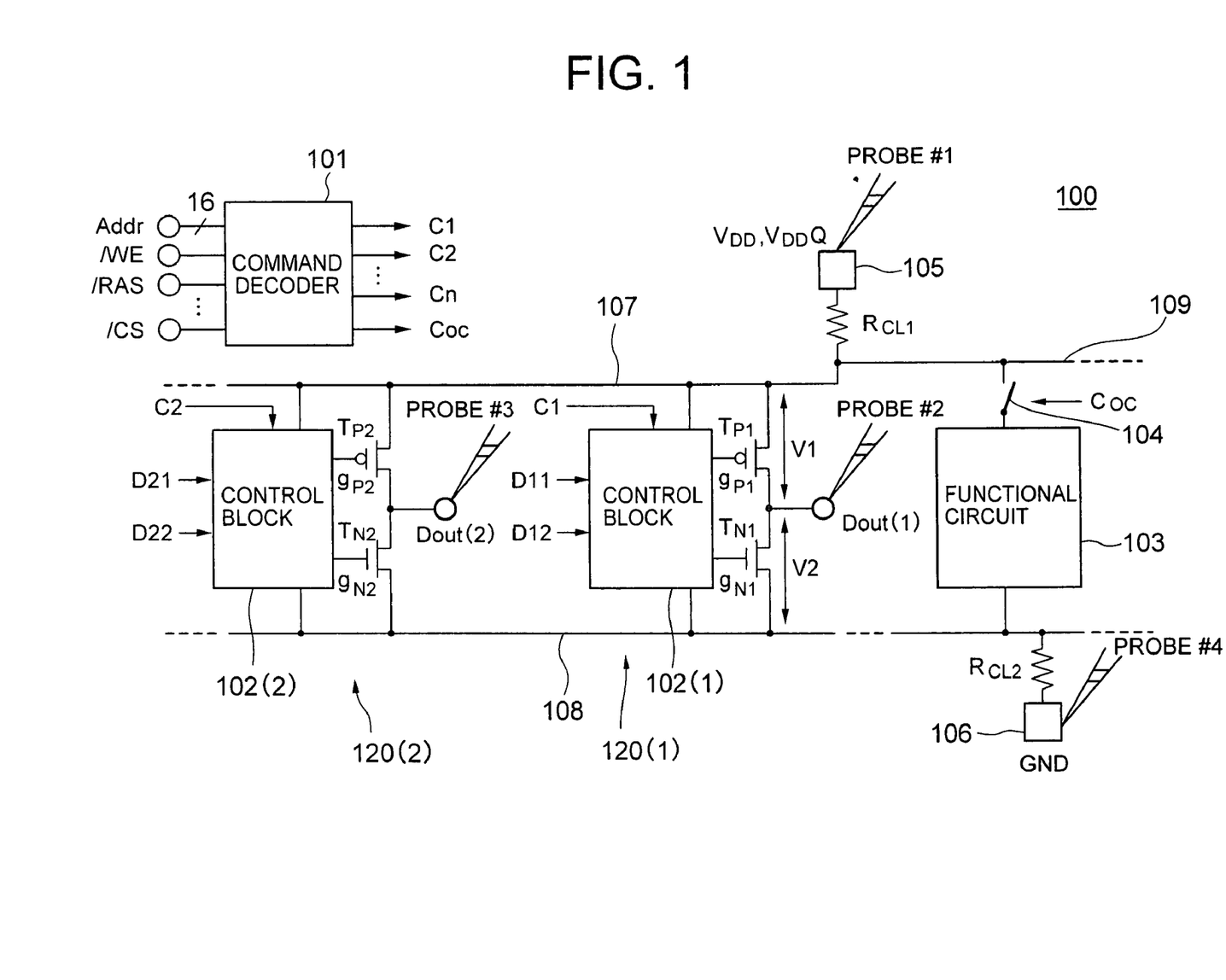
FIG. 1 is a schematic block diagram of a semiconductor device according to a first embodiment of the present invention.

Referring to FIG. 1, a semiconductor device, generally designated by numeral 100, according to a first embodiment of the present invention is configured as a SDRAM (synchronous DRAM) and includes a command decoder 101, a functional circuit block (internal circuit) 103 associated with a switch 104, a VDD pad 105, a GND pad 106, and a plurality (n) of output circuits 120 (120(1) to 120(n)) each including a combination of p-ch MIS transistor TP and n-ch MIS transistor TN, an output terminal Dout (Dout(1) to Dout(n)) and a control block 102, wherein "n" is an integer equal to or larger than 2.

A high-potential power source (VDD) line 107 is connected to the VDD pad 105 which is applied with a power source potential VDD during a normal operation and a test power source potential VDDQ during a test operation. A ground (GND) line 108 is connected to the GND pad 106 which is applied with a ground potential GND, i.e., a low-potential power source potential VSS. The source-drain paths of p-ch MIS transistor TP and n-ch MIS transistor TN are connected in series between the VDD line 107 and the GND line 108. The semiconductor device 100 can deliver an external signal through each output terminal Dout(i) (i=1 to n) connected to the intermediate node which couples the corresponding p-ch MIS transistor and n-ch MIS transistor together.

The command decoder 101 decodes an input address signal Addr having a 16-bit length, for example, and other external control signals such as write enable signal /WE, row address strobe /RAS, and column address strobe /CAS. The command decoder 101 identifies the input command based on the result of decoding the input signals, delivering a control signal Ci (i=1 to n) to the control block 102(i) and an isolation signal Coc to the isolation switch 104 of the functional circuit block 103. The isolation switch 104 is connected between a branch line 109 connected to the VDD pad 105 and the functional circuit block 103, thereby preventing the test current from flowing through the functional circuit block 103 during the characteristic test of the semiconductor device 100. More specifically, the isolation switch 104 responds to the isolation signal Coc supplied from the command decoder 101 to isolate the functional circuit block 103 from the branch line 109.

The control block 102(i) is disposed corresponding to each output circuit 120(i) including a combination of p-ch MIS transistor TP and n-ch MIS transistor TN. Each control block 102(i) receives a control signal Ci from the command decoder 101 and data signal Di1 and Di2, generates gate control signals $g_{Pi}$ and $g_{Ni}$ based on the control signal Ci, delivers the control signals $g_{Pi}$ and $g_{Ni}$ to p-ch MIS transistor TP and n-ch MIS transistor TN, respectively.

Figure 2A:
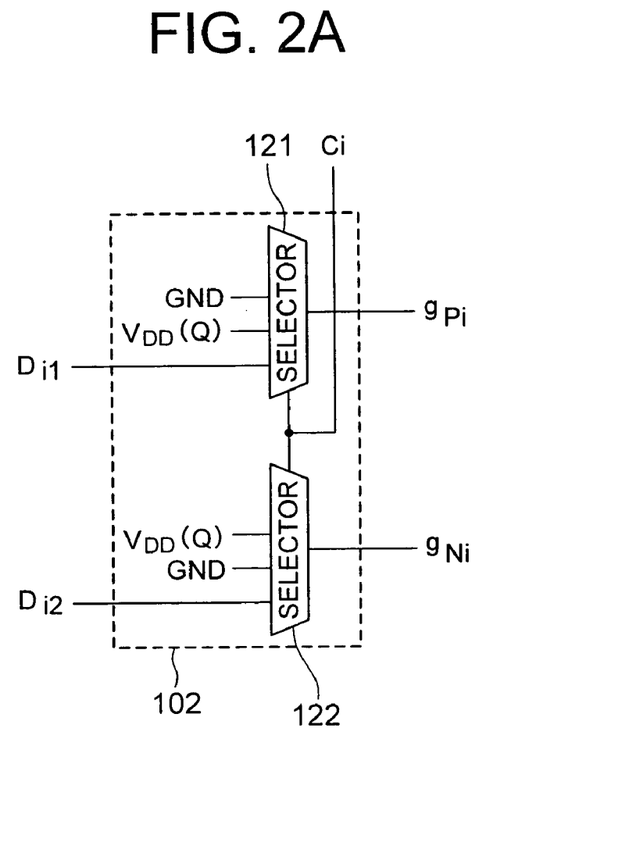
FIG. 2A is a block diagram of the control block shown in FIG. 1.

Referring to FIG. 2A, each control block 102 includes a first selector 121 and a second selector 122. The first selector 121 receives a first data signal Di1, the ground potential GND, and the VDD potential or the test power source potential VDDQ, the first data signal Di1 being delivered to the gate of p-ch MIS transistor TP as a gate control signal $g_{Pi}$ during normal operation mode. The second selector 122 receives a second data signal Di2, the ground potential GND and the VDD potential or the test power source potential VDDQ, the second data signal Di2 being delivered to the gate of n-ch MIS transistor TN as a gate control signal $g_{Ni}$ during the normal operation mode. Each of the first and second selectors 121 and 122 selects one of the inputs based on the control signal Ci delivered from the command decoder 101 to output the selected signal as the gate control signal $g_{Pi}$ or $g_{Ni}$.

Figure 2B:
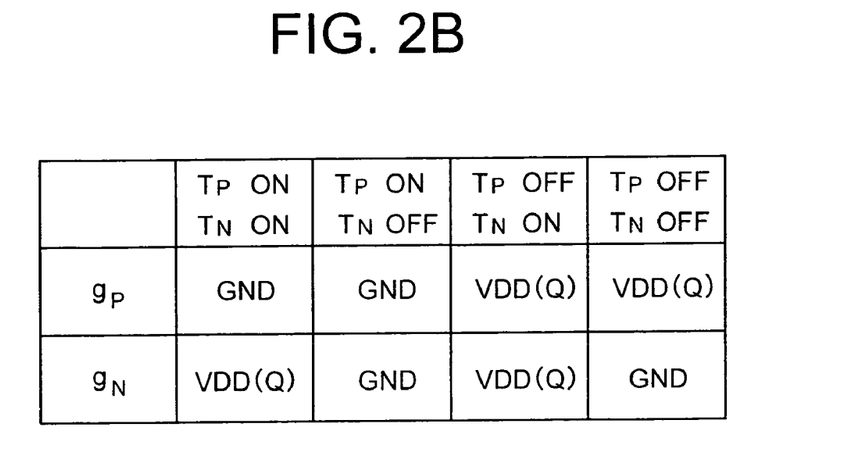
FIG. 2B is a table tabulating the relationships between the output potentials delivered from the control block of FIG. 2A and desired ON or OFF of p-ch and n-ch MIS transistors.

Each control block 102 delivers the first data signal Di1 through the first selector 121 and the second data signal Di2 through the second selector 122 during the normal operation mode. Referring to FIG. 2B, there is shown the relationship between the outputs $g_{Pi}$ and $g_{Ni}$ of the control block 102 and the states of the MIS transistors TPi and TNi during the characteristic test. As shown in FIG. 2B, if both the MIS transistors TPi and TNi are to be turned ON during the characteristic test, the first selector 121 delivers the ground potential GND as the first gate control signal $g_{Pi}$ and the second selector 122 delivers the test power source potential VDDQ as the second gate control signal $g_{Ni}$. If the p-ch and n-ch MIS transistors TPi and TNi are to be turned ON and OFF, respectively, both the first and second selectors 121 and 122 deliver the ground potential GND. If the p-ch MIS transistors TPi and TNi are to be turned OFF and ON, respectively, both the first and second selectors 121 and 122 deliver the test power source potential VDDQ. If both the p-ch and n-ch MIS transistors TPi and TNi are to be turned OFF, the first and second selectors deliver the test power source potential VDDQ and ground potential GND, respectively.

Figure 3:
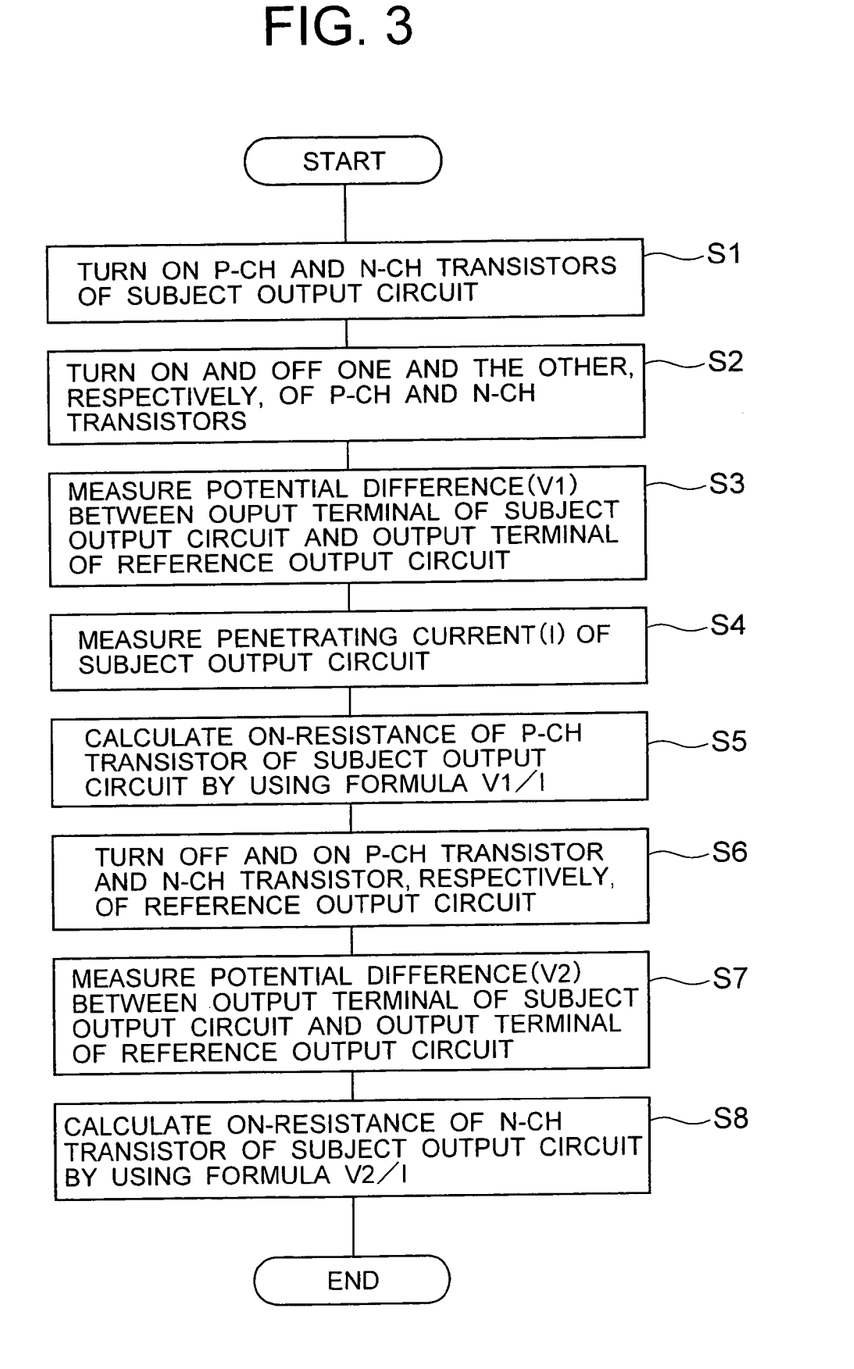
FIG. 3 is a flowchart of the characteristic test conducted for testing the output circuit of the semiconductor device of FIG. 1.

Referring to FIG. 3, there is shown the procedure of the characteristic test for testing the semiconductor device of FIG. 1. This procedure is an exemplified case wherein the first output circuit 120(1) having output terminal Dout(1) is tested while using the second output circuit 120(2) having output terminal Dout(2) as a reference circuit. In this case, four terminals including the VDD pad 105, GND pad 106, first output terminal Dout(1) which is the subject terminal to be tested and second output terminal Dout(2) which is the reference terminal are used in a four-terminal method to measure the ON-resistances of the p-ch and n-ch MIS transistors TP1 and TN2 connected to the first output terminal Dout(1).

For the characteristic test of the first output circuit 120(1) having the first output terminal Dout(1), as shown in FIG. 1, a probe pin #1 is coupled to the VDD pad, probe pin #4 is coupled to the GND pad 106, probe pin #2 is coupled to the first output terminal Dout(1) and probe pin #3 is coupled to the second output terminal Dout(2). A current source is connected between probe pin #1 and probe pin #4, and a voltmeter is connected between probe pin #2 and probe pin #3. It is to be noted that an equivalent resistance $R_{CL1}$ represents a sum of the line resistance from the VDD pad 105 to the p-ch MIS transistor TP1 inclusive of both and the contact resistance between probe pin #1 and the VDD pad 105, whereas an equivalent resistance $R_{CL2}$ represents a sum of the line resistance from the GND pad 106 to the n-ch MIS transistor and the contact resistance between probe pin #4 and the GND pad 106.

The control block 102(1) of the first output circuit 120(1) delivers the ground potential GND as the first gate control signal $g_{P1}$ and the test power source potential VDDQ as the second gate control signal $g_{N1}$ based on the control signal C1 delivered from the command decoder 101, thereby turning ON both the p-ch and n-ch MIS transistors TP1 and TN1 (step S1). Thus, a penetrating current flows from the VDD line 107 to the GND line 108 through the p-ch and n-ch MIS transistors TP1 and TN1 of the first output circuit 120(1). The control block 102(2) of the reference output circuit 120(2) connected between the VDD line and the GND line delivers GND potential as the first and second gate control signals $g_{P2}$ and $g_{N2}$, thereby turning ON p-ch MIS transistor TP2 and tuning OFF n-ch MIS transistor TN2 (step S2).

At this stage, other control blocks 102(3) to 102(n) deliver the test power source potential VDDQ as the first and second gate control signals $g_{Pi}$ and $g_{Ni}$ (i=3 to n) based on the control signal Ci supplied from the command decoder 101, thereby turning OFF respective p-ch and n-ch MIS transistors TPi and TNi. In addition, the isolation switch 104 isolates the functional circuit block 103 connected between the VDD pad 105 and GND pad 106 from the branch line 109 based on the isolation signal Coc supplied from the command decoder 101. Thus, the current supplied from probe pin #1 through VDD pad 105 flows through only the combination of p-ch and n-ch MIS transistors in the first output circuit 120(1) to be tested and through GND pad 106 toward probe pin #4.

The potential difference between the first output terminal Dout(1) and the second output terminal Dout(2) is measured by using probe pins #2 and #3 (step S3). At this stage, since only p-ch MIS transistor TP2 in the second output circuit 120(2) or reference circuit is ON, the second output terminal Dout(2) assumes the potential of the VDD line 107. Thus, the potential difference between the first output terminal Dout(1) and the second output terminal Dout(2) is equal to the potential difference between the VDD line 107 and the first output terminal Dout(1), i.e., equal to the voltage drop of the source-drain path of p-ch MIS transistor TP1 of the first output circuit 120(1).

Figure 4:
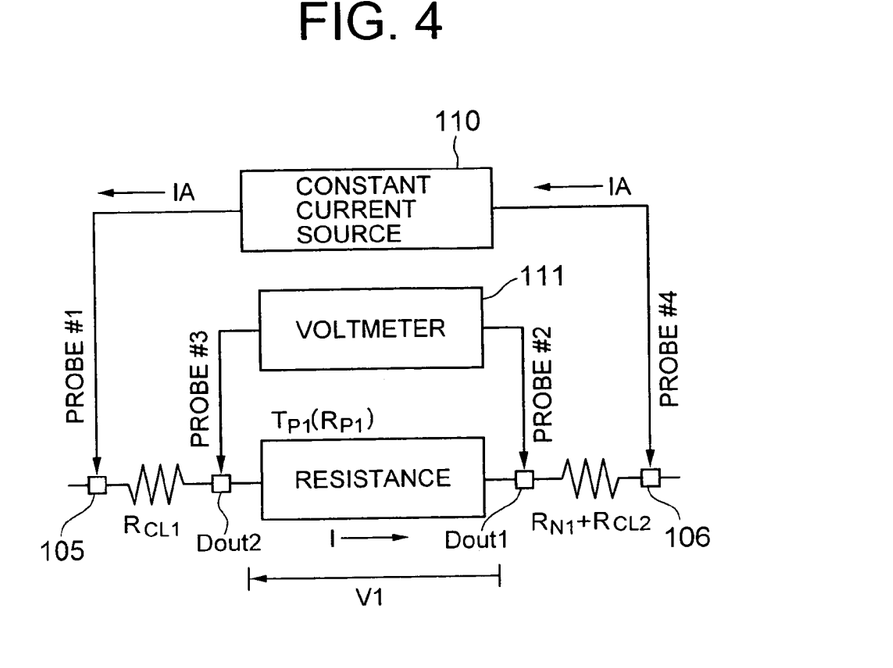
FIG. 4 is an equivalent circuit diagram of a test circuit during a first stage of testing the semiconductor device of FIG. 1.

Referring to FIG. 4, there is shown the equivalent circuit of the semiconductor device 100 at this step S3 of the characteristic test. A current IA is supplied from the constant current source 110 outside the semiconductor device 100 toward the subject first output circuit 120(1) through probe pin #1 and VDD pad 105. The current IA flows through equivalent resistance $R_{CL1}$, subject p-ch MIS transistor TP1 (i.e., ON-resistance $R_{P1}$), n-ch MIS transistor TN1 (i.e., ON-resistance $R_{N1}$), and equivalent resistance $R_{CL2}$ to the GND pad 106 and probe pin #4.

Back to FIG. 3, the current IA flowing from probe pin #1 to probe pin #4 is measured (step S4), and the ON-resistance $R_{P1}$ of p-ch MIS transistor TP1 is obtained based on the current IA and the voltage V1 measured at step S3 from the Ohm's law (step S5).

After the ON-resistance $R_{P1}$ of p-ch MIS transistor TP1 is measured, the control block 102(2) of the second output circuit 120(2) delivers the test power source potential VDDQ as the first and second gate control signals $g_{P2}$ and $g_{N2}$, thereby turning OFF and ON p-ch MIS transistor TP2 and n-ch MIS transistor TN2, respectively (step S6). The potential difference V2 between the first output terminal Dout(1) and the second output terminal Dout(2) is again measured by using probe pins #2 and #3 (step S7). Since the potential of the second output terminal Dout(2) is equal to the GND potential due to the ON-state of n-ch MIS transistor TN2, the potential difference between the potential of the first output terminal Dout(1) and the potential of the second output terminal Dout(2) equals to the voltage drop of the source-drain path of n-ch MIS transistor TN1 of the first output circuit 120(1).

Figure 5:
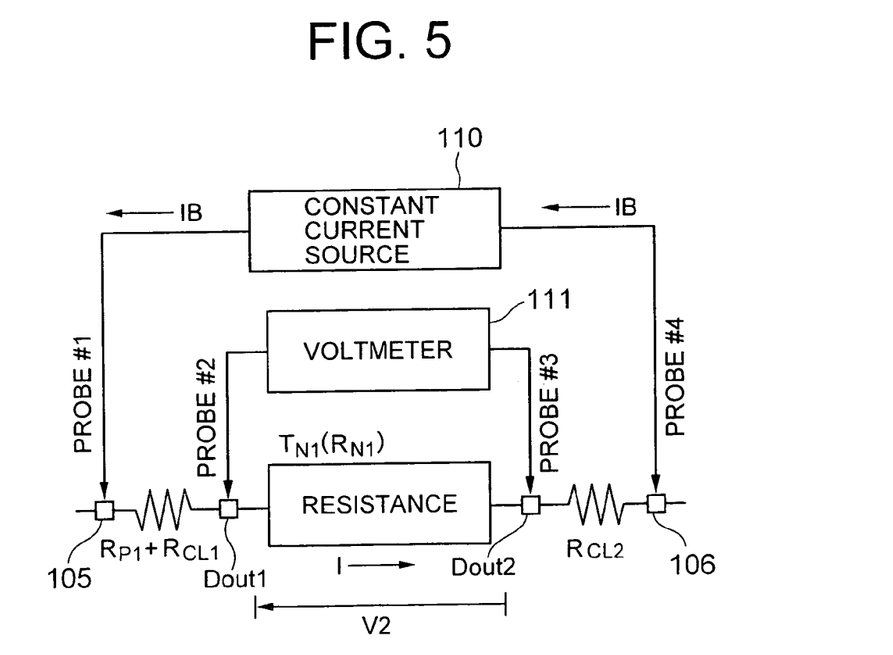
FIG. 5 is an equivalent circuit diagram of another test circuit during a second stage of testing the semiconductor device of FIG. 1.

Referring to FIG. 5, there is shown an equivalent circuit of the semiconductor device 100 at the step S7. A current IB is supplied from the constant current source 110 toward the subject first output circuit 120(1) through probe pin #1 and VDD pad 105. The current IA flows through the equivalent resistance $R_{CL1}$, p-ch MIS transistor TP1 (ON-resistance $R_{P1}$), subject n-ch MIS transistor TN1 (ON-resistance $R_{N1}$), and the equivalent resistance $R_{CL2}$ to the GND pad 106 and probe pin #4. Back to FIG. 3, the ON-resistance $R_{N1}$ of subject n-ch MIS transistor TN1 is obtained based on the current IB and the voltage V2 measured at step S7 from the Ohm's law (step S8).

In the above embodiment, as described above, the second output circuit 120(2) connected between the VDD line 107 and the GND line 108 in common with the subject output circuit 120(1) is used as the reference circuit, wherein one and the other of p-ch and n-ch MIS transistors TP2 and TN2 are turned ON and OFF, respectively. In this configuration, the output terminal Dout(2) of the reference output circuit 120(2) has the potential of the VDD line or the GND line. Both p-ch and n-ch MIS transistors in the subject first output circuit 120(1) are turned ON to flow a penetrating current therethrough. The ON-resistance $R_{P1}$ or $R_{N1}$ of p-ch or n-ch MIS transistor TP1 or TN1 can be calculated based on the current value of the penetrating current and the potential difference between the output terminal Dout(1) of the subject output circuit 120(1) and the output terminal Dout(2) of the reference output circuit 120(2). Since a current does not flow between probe pin #2 and probe pin #3 (FIGS. 4 and 5), the characteristic test can be conducted without being affected by the contact resistances between the probe pins and the terminals, thereby improving the accuracy in the characteristic test.

In the conventional technique shown in FIG. 7, the test power source potential and the GND potential are delivered at two stages through the dedicated test terminals for measuring the voltage drops of the emitter-to-collector current path for alleviating the influence by the contact resistances. This results in an increased number of external terminals. On the other hand, in the above embodiment, the output terminal of another output circuit provided in the semiconductor device is used as the reference terminal, thereby avoiding the increase of the number of external terminals in the semiconductor device. Although each output circuit used as the reference output circuit is provided with the control block 102(i), increase of the dimensions of the semiconductor device caused by the provision of the control block 102(i) is far less than the increase of the dimensions of the semiconductor device caused by provision of the dedicated test terminals.

Figure 6:
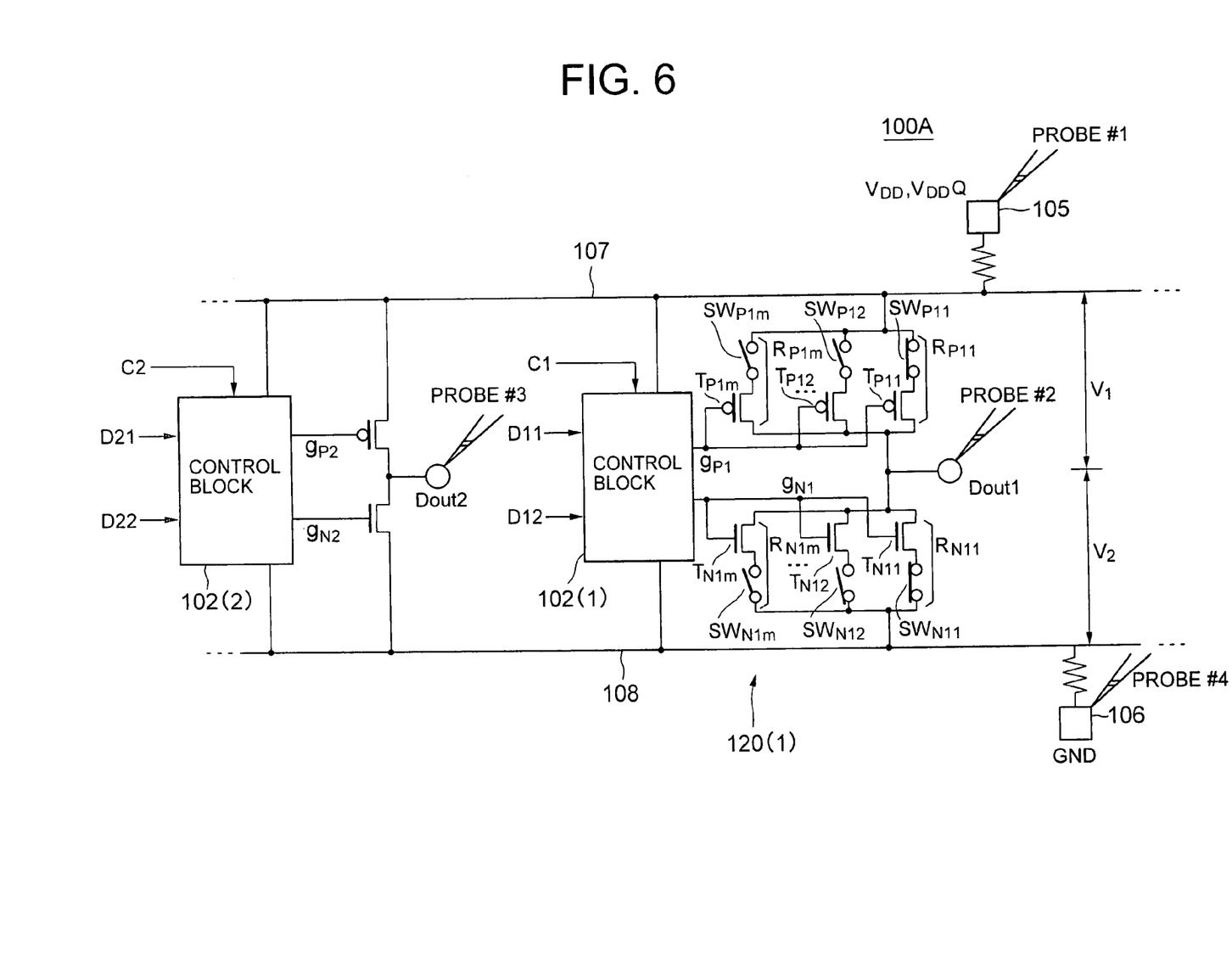
FIG. 6 is a schematic block diagram of a semiconductor device according to a second embodiment of the present invention.

Referring to FIG. 6, there is shown a semiconductor device according to a second embodiment of the present invention. The semiconductor device 100A of the present embodiment is similar to the semiconductor device 100 of the first embodiment except that each output circuit 120(i) includes a plurality (m) of p-ch MIS transistor elements TPik (i=1 to n, and k=1 to m) and a plurality (m) of n-ch MIS transistor elements TNik in the present embodiment. MIS transistor elements TPik and TNik are associated with respective isolation switches SWPi1 to SWPim and SWNi1 to SWNim, each of which is connected in series with a corresponding MIS transistor element, between the VDD line 107 and the output terminal Dout(i) or between the GND line 108 and the output terminal Dout(i). Each switch may be implemented by a fuse, for example.

The ON-resistance for the output circuit 120(1) between the VDD line 107 and the output terminal Dout(1), for example, is selected by the number of p-ch MIS transistor elements connected between the VDD line 107 and the output terminal Dout(1) by selecting the ON or OFF of the switches SWP11 to SWP1m. The same applies to the ON-resistance for the output circuit 120(1) between the GND line 108 and the output terminal Dout(1). After the ON-resistance for each number of MIS transistor elements is measured by using the procedure shown in FIG. 4, the number of MIS transistor elements effectively left in the output circuit 120(1) is selected by ON or OFF of the switches to adjust the ON- resistance for the output circuit 120(1) at a desired value.

In the above embodiments, the output circuit 120(i) includes a combination of p-ch and n-ch MIS transistors. However, the present invention is not limited to such an output circuit including a combination of MIS transistors and may be applied to any output circuit so long as the output circuit includes a switching element for coupling the VDD line or the GND line to the output terminal.

Although the second output circuit 120(2) is used as the reference output circuit for testing the first output circuit 120(1), the reference circuit may be any output circuit so long as the any output circuit is connected between the VDD pad 105 and the GND pad 106 in common with the subject output circuit 120(1) to be tested. It is preferable that the subject output circuit and the reference output circuit are connected to the common branch line of the VDD line or the GND line for improving the accuracy of the measured ON-resistance.

In the second embodiment, it is not necessary that the number of p-ch MIS transistors be equal to the number of n-ch MIS transistors. In addition, it is not necessary all the output circuits have the plurality of pc-h or n-ch MIS transistor elements, and one or any number of the output circuits may have such a configuration.

In the second embodiment, a switch and a MIS transistor are provided in pair in the output circuit, and all the p-ch and all the n-ch MIS transistors in each output circuit are controlled by the same gate control signals gPi and gNi, respectively. However, each MIS transistor may be provided without a switch, so long as the MIS transistor is controlled by a dedicated gate control signal. In such a case, one of the p-ch or n-ch MIS transistors is controlled by a gate control signal and the other of the p-ch or n-ch transistors is controlled by a dedicated gate control signal which may be stored in a register provided in the semiconductor device.

Since the above embodiments are described only for examples, the present invention is not limited to the above embodiments and various modifications or alterations can be easily made therefrom by those skilled in the art without departing from the scope of the present invention.

What is claimed is:

1. A method for testing a semiconductor device including first and second power source lines, a plurality of output circuits, and a plurality of output terminals each disposed for one of said output circuits, each of said output circuits including a combination of first and second transistors connected together in series via a first node and between said first power source line and said second power source line, said first node being connected to a corresponding one of said output terminals, said method comprising:

controlling said output circuits to turn ON said first and second transistors of a first output circuit among said plurality of output circuits, to turn ON one of said first transistor and said second transistor of a second output circuit among said plurality of output circuits, and to turn OFF another of said first transistor and said second transistor of said second output circuit;

measuring a potential difference between said output terminal of said first output circuit and said output terminal of said second output circuit and a penetrating current flowing through said first and second transistors of said first output circuit; and calculating a characteristic of one of said first transistor and said second transistor of said first output circuit, based on said potential difference and said penetrating current and which of said first transistor and said second transistor of said second output circuit is ON.

2. The method according to claim 1, wherein at least one of said first and second transistors comprises a plurality of transistor elements connected in parallel, and a specified number of said transistor elements among said plurality of transistor elements are turned ON during said controlling.

3. The method according to claim 1, further comprising: selecting an arbitrary two of said plurality of output circuits as said first and second output circuits, before said controlling.

4. The method according to claim 1, wherein said controlling uses external pins of said semiconductor device to turn ON said first and second transistors of said first output circuit and to turn ON/OFF said first transistor and said second transistor of said second output circuit.

5. The method according to claim 1, wherein said measuring uses a constant current source connected between said first power source line and said second power source line.

* * * * *